US012765001B2

(12) United States Patent
Jung et al.

(10) Patent No.: US 12,765,001 B2

(45) Date of Patent: Oct. 13, 2026

(54) SEMICONDUCTOR DEVICE AND METHOD OF MANUFACTURING THE SAME

(71) Applicant: Samsung Electronics Co., Ltd., Suwon-si (KR)

(72) Inventors: Moonil Jung, Suwon-si (KR); Sangwook Kim, Suwon-si (KR); Euntae Kim, Suwon-si (KR); Jeeeun Yang, Suwon-si (KR); Kwanghee Lee, Suwon-si (KR); Youngkwan Cha, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 383 days.

(21) Appl. No.: 18/496,353

(22) Filed: Oct. 27, 2023

(65) Prior Publication Data

US 2024/0162350 A1 May 16, 2024

(30) Foreign Application Priority Data

Nov. 15, 2022 (KR) ........................ 10-2022-0152737

(51) Int. Cl.

*H01L 29/786* (2006.01)
*H01L 29/10* (2006.01)

(Continued)

(52) U.S. Cl.

CPC ..... *H10D 30/6755* (2025.01); *H10D 30/6734* (2025.01); *H10D 30/6757* (2025.01); *H10D 30/751* (2025.01); *H10D 99/00* (2025.01)

(58) Field of Classification Search

CPC ............... H10D 30/6755; H10D 30/67; H10D 30/6734; H10D 30/6757; H10D 30/69;

(Continued)

(56) References Cited

U.S. PATENT DOCUMENTS 8,410,838 B2 4/2013 Kato et al.
8,559,220 B2 10/2013 Yamazaki et al.

(Continued)

FOREIGN PATENT DOCUMENTS

KR 10-2017-0041433 A 4/2017
KR 10-2163730 B1 10/2020

(Continued)

OTHER PUBLICATIONS

Jae Gwang Um et al., "Heavily doped n-type a-IGZO by F plasma treatment and its thermal stability up to 600° C.", Applied Physics Letters, 112(16), 162104 (2018).

(Continued)

*Primary Examiner* — Nikolay K Yushin

(74) *Attorney, Agent, or Firm* — Harness, Dickey & Pierce, P.L.C.

(57) ABSTRACT

Semiconductor devices and manufacturing methods thereof are provided. A semiconductor device includes a substrate, a lower electrode on the substrate, an oxide channel on the lower electrode, the oxide channel including vertical extension portions extending in a first direction perpendicular to the substrate, an upper electrode on the oxide channel, a gate insulator on a portion the oxide channel that is exposed by the lower electrode and the upper electrode, and a gate electrode on the gate insulator, wherein the upper electrode and the lower electrode are separated from each other by the oxide channel in the first direction, and the oxide channel is doped with ions.

18 Claims, 20 Drawing Sheets

(51) Int. Cl.

| | |
|---|---|
| ***H01L 29/66*** | (2006.01) |
| ***H10D 30/67*** | (2025.01) |
| ***H10D 30/69*** | (2025.01) |
| ***H10D 99/00*** | (2025.01) |

(58) Field of Classification Search

CPC ........... H10D 30/6728; H10D 30/6735; H10D 99/00; H10D 30/6708; H10D 30/6715; H10D 30/751

See application file for complete search history.

(56) References Cited

U.S. PATENT DOCUMENTS

| | | | | |
|---|---|---|---|---|
| 8,883,556 | B2 | 11/2014 | Yamazaki | |
| 9,177,872 | B2 | 11/2015 | Sandhu | |
| 9,431,441 | B1 | 8/2016 | Zhou et al. | |
| 9,508,865 | B2 | 11/2016 | Seon et al. | |
| 9,564,217 | B1 | 2/2017 | Zhou et al. | |
| 9,711,549 | B2 | 7/2017 | Yamazaki et al. | |
| 10,192,913 | B2 | 1/2019 | Kurokawa | |
| 10,236,033 | B2 | 3/2019 | Koyama et al. | |
| 10,347,637 | B2 | 7/2019 | Sandhu | |
| 10,522,693 | B2 | 12/2019 | Kurokawa | |
| 10,656,799 | B2 * | 5/2020 | Takesue | G06F 1/165 |
| 11,581,366 | B2 * | 2/2023 | Wu | H10B 61/22 |
| 2019/0051755 | A1 | 2/2019 | Yamazaki et al. | |
| 2020/0044095 | A1 | 2/2020 | Wang et al. | |
| 2020/0091156 | A1 | 3/2020 | Sharma et al. | |
| 2020/0227519 | A1 | 7/2020 | Song et al. | |
| 2021/0367080 | A1 | 11/2021 | Lee et al. | |
| 2021/0399046 | A1 * | 12/2021 | Wu | H10B 61/22 |
| 2022/0199625 | A1 | 6/2022 | Lee et al. | |
| 2024/0120379 | A1 | 4/2024 | Jeong et al. | |

FOREIGN PATENT DOCUMENTS

| | | | |
|---|---|---|---|
| KR | 10-2316181 | B1 | 10/2021 |
| KR | 20210157871 | A | 12/2021 |
| KR | 10-2401958 | B1 | 5/2022 |
| KR | 10-2022-0089875 | A | 6/2022 |

OTHER PUBLICATIONS

Korean Office Action for corresponding Korean Application No. 10-2022-0152737 dated May 24, 2026.

* cited by examiner

SEMICONDUCTOR DEVICE AND METHOD OF MANUFACTURING THE SAME

CROSS-REFERENCE TO RELATED APPLICATION

This application is based on and claims priority under 35 U.S.C. § 119 to Korean Patent Application No. 10-2022-0152737, filed on Nov. 15, 2022, in the Korean Intellectual Property Office, the disclosure of which is incorporated by reference herein in its entirety.

BACKGROUND

1. Field

The disclosure relates to semiconductor devices and/or methods of manufacturing the same.

2. Description of the Related Art

A transistor is a semiconductor device that plays an electrical switching role and is employed in various integrated circuit devices including memories, driving ICs (Integrated Circuits), logic devices, and the like. In order to increase the degree of integration of an integrated circuit device, a space occupied by transistors included in the integrated circuit device has been rapidly reduced, and thus research has been conducted to reduce the size of a transistor while maintaining the performance thereof.

One of the important parts of a transistor is a gate electrode. When a voltage is applied to the gate electrode, a channel adjacent to a gate opens a path for current, and in the opposite case, the current is blocked. The performance of a semiconductor depends on how much leakage current is reduced and efficiently managed in the gate electrode and channel. In a transistor, the larger the contact area where the gate electrode that controls a current contacts the channel, the higher the power efficiency.

As a semiconductor process becomes finer, the size of the transistor decreases and the contact area between the gate electrode and the channel decreases, and causes problems due to a short channel effect. For example, phenomena such as threshold voltage variation, carrier velocity saturation, and deterioration of the subthreshold characteristics occur. Accordingly, a method of effectively reducing the channel length, while overcoming the short channel effect, has been studied.

SUMMARY

Some example embodiments provide semiconductor devices.

Some example embodiments provide methods of manufacturing a semiconductor device.

Additional aspects will be set forth in part in the description which follows and, in part, will be apparent from the description, or may be learned by practice of the presented example embodiments of the disclosure.

According to an aspect of the disclosure, a semiconductor device may include a substrate, a lower electrode on the substrate, an oxide channel on the lower electrode, the oxide channel including vertical extension portions extending in a first direction perpendicular to the substrate, an upper electrode on the oxide channel, a gate insulator on a portion of the oxide channel that is exposed by the lower electrode and the upper electrode, a gate electrode on the gate insulator, wherein the upper electrode and the lower electrode are separated from each other by the oxide channel in the first direction, and the oxide channel is doped with ions.

The ions may include ions selected from the group consisting of F (Fluorine), Cl (Chlorine), Br (Bromine), I (Iodine), At (Astatine), and a combination thereof.

The oxide channel may include a bottom portion in contact with the lower electrode, and the vertical extension portions extending in the first direction at both ends of the bottom portion, and a mass percentage of ions of the bottom portion may be greater than a mass percentage of ions of the vertical extension portions.

The mass percentage of ions of the bottom portion of the oxide channel may be greater than about 10.0 wt % and less than about 50.0 wt %.

The mass percentage of ions in the vertical extension portions of the oxide channel may be about 0.1 wt % to about 10.0 wt %.

The oxide channel may include one selected from the group consisting of In (Indium), Zn (Zinc), Sn (tin), Ga (Gallium), Hf (Hafnium), and a combination thereof.

The oxide channel may include In, and an atomic percentage of In included in the oxide channel is about 5 at % to about 55 at %.

The oxide channel may include Ga of about 30 at % to about 95 at %.

The lower electrode may include at least one of W (tungsten), Co (cobalt), Ni (nickel), Fe(iron), Ti (titanium), Mo (molybdenum), Cr (chromium), Zr (zirconium), Hf (hafnium), Nb (niobium), Ta (tantalum), Ag (silver), Au (gold), Al (aluminum), Cu (copper), Sb (antimony), V (vanadium), Ru(ruthenium), Pt (platinum), Zn (zinc), and Mg (magnesium).

Each of the oxide channel, the gate insulator, and the gate electrode may be includes a vertical extension portion extending in the first direction.

The gate electrode may surround the oxide channel.

The oxide channel may have a U-shaped cross section.

The vertical extension portions may include a first vertical extension portion extending from one end of the bottom portion in the first direction, and a second vertical extension portion extending from the other end of the bottom portion in the first direction, and the gate electrode includes a first gate electrode one the first vertical extension portion and extending in the first direction and a second gate electrode on the second vertical extension portion and extending in the first direction.

The lower electrode and the oxide channel may have same width.

According to another aspect of the disclosure, a method of manufacturing a semiconductor device may include providing a lower electrode on a substrate, depositing an oxide channel on the lower electrode, doping the oxide channel with ions, depositing a gate insulator on the oxide channel, depositing a gate electrode on the gate insulator, and depositing an upper electrode on the oxide channel, wherein the upper electrode and the lower electrode are spaced apart from each other by the oxide channel in a first direction perpendicular to the substrate, and the oxide channel includes vertical extension portions extending in the first direction, and the upper electrode contacts a top surface of the oxide channel.

The ions may be selected from the group consisting of F (Fluorine), Cl (Chlorine), Br (Bromine), I (Iodine), At (Astatine), and a combination thereof.

The depositing an oxide channel may include depositing the oxide channel that includes a bottom portion contacting the lower electrode and the vertical extension portions extending from the bottom portion in the first direction, the doping the oxide channel with ions may include doping vertical extension portions of the oxide channel and doping the bottom portion of the oxide channel, and a mass percentage of ions in the bottom portion may be greater than a mass percentage of ions in the vertical extension portion.

The mass percentage of ions of the bottom portion of the oxide channel may be in a range from about 10.0 wt % to about 50.0 wt %.

The mass percentage of ions in the length direction may be in a range from about 0.1 wt % to about 10.0 wt.

The oxide channel may include In of about 5 at % to about 55 at % and Ga of about 30 at % to about 45 at %.

BRIEF DESCRIPTION OF THE DRAWINGS

The above and other aspects, features, and advantages of some example embodiments of the disclosure will be more apparent from the following description taken in conjunction with the accompanying drawings, in which.

DETAILED DESCRIPTION

Figure 1:
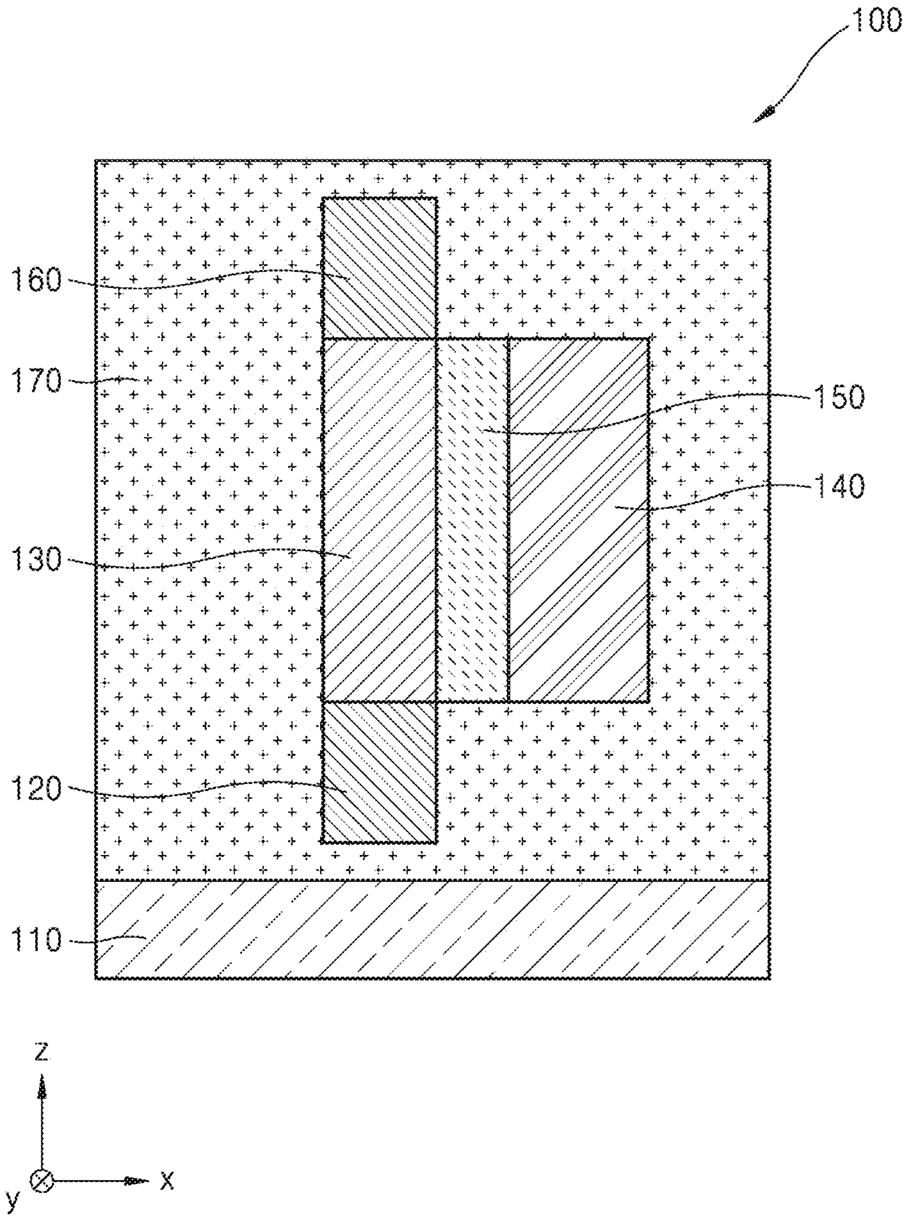
FIG. 1 is a diagram illustrating a semiconductor device according to an example embodiment.

Reference will now be made in detail to some example embodiments, which are illustrated in the accompanying drawings, wherein like reference numerals refer to like elements throughout. In this regard, the present example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereafter, semiconductor devices and methods of manufacturing the same according to the disclosure will be described more fully with reference to the accompanying drawings, In the drawings, like reference numerals refer to like elements throughout, and sizes of elements in the drawings may be exaggerated for clarity and convenience of explanation. Although the terms "first", "second", etc. may be used herein to describe various elements, these elements should not be limited by these terms. These terms are only used to distinguish one element from another.

The singular forms include the plural forms unless the context clearly indicates otherwise. It should be understood that, when a part "comprises" or "includes" an element in the specification, unless otherwise defined, other elements are not excluded from the part and the part may further include other elements. Also, sizes and thicknesses of elements in the drawings may be exaggerated for clarity and convenience of explanation.

In the specification, the term "above" and similar directional terms may be applied to both singular and plural.

The operations of all methods described herein may be performed in any suitable order unless otherwise indicated herein or otherwise clearly contradicted by context. The use of any and all examples, or exemplary language (e.g., "such as") provided herein, is intended merely to better illuminate the disclosure and does not pose a limitation on the scope of the disclosure unless otherwise claimed.

Recently, Si-based memories or logic devices have reached the limit of high integration and as a channel length of several tens or several nanometers are required or desired. Thus, reducing off-current has become very important. In addition, as characteristics required or desired to clearly distinguish between on/off states, a subthreshold swing (SS) and/or an on/off current ratio (on/off ratio) may need to be improved. An oxide semiconductor transistor used as a large-area display driver may have excellent characteristics (e.g., low off-current, low SS, and/or high on/off current ratio). Accordingly, a method of utilizing an oxide semiconductor device having advantages in a memory or logic device and/or increasing the degree of integration has recently been proposed.

However, it may be difficult to directly apply such an oxide semiconductor transistor to a display driver due to a short-channel effect by scaling down, which may cause characteristics of the display driver to be deteriorated. For example, electrical characteristics of the display driver may change due to heat generated during device processing or transistor operation. This may be due to a structural form of an amorphous indium gallium zinc oxide (IGZO) thin film or the generation of oxygen vacancies through which oxygen escapes by heat. Hereinafter, semiconductor devices and/or methods of manufacturing a semiconductor device, which is capable of inducing a stable metal-anion bond, increasing the stability of an amorphous structure, and securing device stability even at a high temperature by doping ions into a semiconductor channel, will be described.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

FIG. 1 is a diagram illustrating a semiconductor device 100 according to an example embodiment.

Referring to FIG. 1, the semiconductor device 100 may include a substrate 110, a lower electrode 120, an oxide channel 130, a gate electrode 140, a gate insulator 150, an upper electrode 160, and/or a mold insulator 170.

The substrate 110 may be provided in a flat plate shape extending along one plane. A vertical direction z may be a direction perpendicular to the substrate 110. As an example, the substrate 110 may include a conductive substrate. The substrate 110 may be an insulating substrate or a semiconductor substrate having an insulating layer on a surface thereof.

The lower electrode 120 may be disposed on the substrate 110. The lower electrode 120 is positioned above the substrate 110 and may be positioned below the oxide channel 130. The lower electrode 120 may be positioned in the vertical direction z of the substrate 110. The oxide channel 130 may function as a channel layer. The lower electrode 120 may include a metal material. The lower electrode 120 may include at least one selected from the group consisting of W (tungsten), Co (cobalt), Ni (nickel), Fe (iron), Ti (titanium), Mo (molybdenum), Cr (chromium), Zr (zirconium), Hf (hafnium), Nb (niobium), Ta (tantalum), Ag (silver), Au (gold), Al (aluminum), Cu (copper), Sb (antimony), V (vanadium), Ru (ruthenium), Pt (platinum), Zn (zinc), and Mg (magnesium). The lower electrode 120 may be in direct contact with the substrate 110, but may be electrically connected to the substrate 110 even if not in direct contact with it.

The oxide channel 130 may be disposed on the lower electrode 120. The oxide channel 130 may be in contact with an upper surface of the lower electrode 120. The oxide channel 130 may extend in a direction in which the substrate 110 and the lower electrode 120 are stacked, and a long direction (e.g., an extension direction) of the oxide channel 130 may be disposed in a direction z perpendicular to the substrate 110. The oxide channel 130 may cover the entire upper surface of the lower electrode 120. The oxide channel 130 may be deposited using an atomic layer deposition (ALD) method. The oxide channel 130 may be deposited using a plasma enhanced-atomic layer deposition (PE-ALD) method. The oxide channel 130 may be selected from the group consisting of InGaZnO, ZnO, ZrInZnO, InZnO, $InGaZnO_4$, ZnInO, ZnSnO, $In_2O_3$, $Ga_2O_3$, HfInZnO, GaInZnO, $HfO_2$, $SnO_2$, $WO_3$, $TiO_2$, $Ta_2O_5$, $In_2O_3SnO_2$, MgZnO, $ZnSnO_3$, $ZnSnO_4$, CdZnO, $CuAlO_2$, $CuGaO_2$, $Nb_2O_5$, $TiSrO_3$, zinc indium oxide (ZIO), indium gallium oxide (IGO), and a combination thereof. The oxide channel 130 may function as a channel layer and may have a band gap of 3.0 ev or more.

Here, the oxide channel 130 may be doped with an anion. The anion may include one selected from the group consisting of F (Fluorine), Cl (Chlorine), Br (Bromine), I (iodine), At (Astatine), and a combination thereof. When the oxide channel 130 is doped with F ions, the dose of F ions may be about $1\times10^{15}/cm^2$. In some example embodiments, the oxide channel 130 may be doped with a cation.

Further, In, Ga, and Zn of the oxide channel 130 may have atomic ratios (at %) that may increase reliability of the semiconductor device. An atomic ratio of In among materials constituting the thin film of the oxide channel 130 may be 55 at % or less. An atomic ratio of In among materials constituting the thin film of the oxide channel 130 may be 5 at % or more. In some example embodiments, an atomic ratio of In among materials constituting the thin film of the oxide channel 130 may be about 5 at % to 55 at %. An atomic ratio of Ga among materials constituting the thin film of the oxide channel 130 may be 30 at % or more. An atomic ratio of Ga among materials constituting the thin film of the oxide channel 130 may be 95 at % or less in the case of a binary system, and may be 90% or less in the case of a ternary system. In some example embodiments, an atomic ratio of Ga among materials constituting the thin film of the oxide channel 130 may be about 30 at % to 45 at %.

The gate electrode 140 may be spaced apart from the oxide channel 130. The gate electrode 140 may be disposed to face part or all of the oxide channel 130. The gate electrode 140 may include an electrically conductive material. For example, the gate electrode 140 may include metal or a metal compound. In this case, the gate insulator 150 may be disposed between the oxide channel 130 and the gate electrode 140 to electrically disconnect the oxide channel 130 and the gate electrode 140. The gate insulator 150 may include an insulating material. For example, the gate insulator 150 may include a dielectric. A width of the gate insulator 150 may be the same as that of the gate electrode 140. The gate insulator 150 and the gate electrode 140 may not be deposited at a top surface of the oxide channel 130.

The upper electrode 160 may be disposed on the oxide channel 130. The upper electrode 160 may include a metal material. The upper electrode 160 may be positioned on the oxide channel 130 in a direction in which the lower electrode 120 and the oxide channel 130 are sequentially stacked. The upper electrode 160 may be positioned in a vertical direction of the oxide channel 130. The lower electrode 120, the oxide channel 130, and the upper electrode 160 may be sequentially stacked in a direction perpendicular to the substrate 110 without any intervening layers. The upper electrode 160 may be deposited to contact the top surface of the oxide channel.

The mold insulator 170 may fill an empty space so that the lower electrode 120, the oxide channel 130, the upper electrode 160, the gate electrode 140, and the gate insulator 150 are fixed on the substrate 110. The mold insulator 170 may include an insulating material.

The oxide channel 130, the gate electrode 140, and/or the gate insulator 150 may be disposed vertically on the substrate 110, respectively, and the semiconductor device 100 may have a 3D structure (e.g., a vertical channel structure). A length direction of the oxide channel 130 may be perpendicular to the substrate 110.

Figure 2:
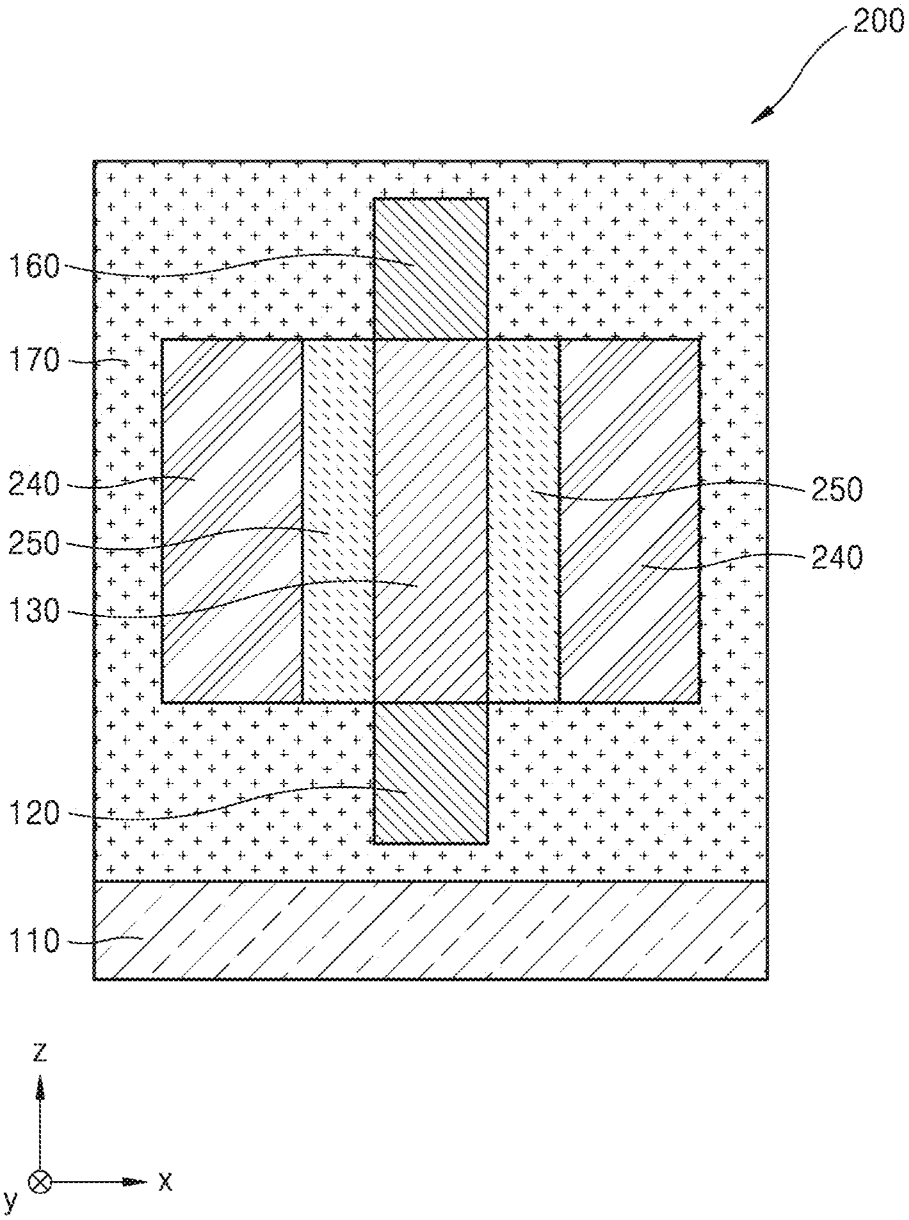
FIG. 2 is a diagram illustrating a semiconductor device according to another example embodiment.

FIG. 2 is a diagram illustrating a semiconductor device 200 according to another example embodiment. In FIG. 2, components using the same reference numerals as those in FIG. 1 have substantially the same configuration and operation effect as those described in FIG. 1, and thus detailed descriptions thereof are omitted.

Referring to FIG. 2, the semiconductor device 200 includes a lower electrode 120, an oxide channel 130, and an upper electrode 160 arranged in a direction (z direction) perpendicular to a substrate 110. A gate insulator 260 may be provided around the oxide channel 130, and a gate electrode 250 may be provided to surround the gate insulator 260. The gate electrode 250 is provided to surround the oxide channel 130 to increase an area where the gate electrode 250 and the oxide channel 130 face each other and thus to improve a short channel effect.

Figure 3:
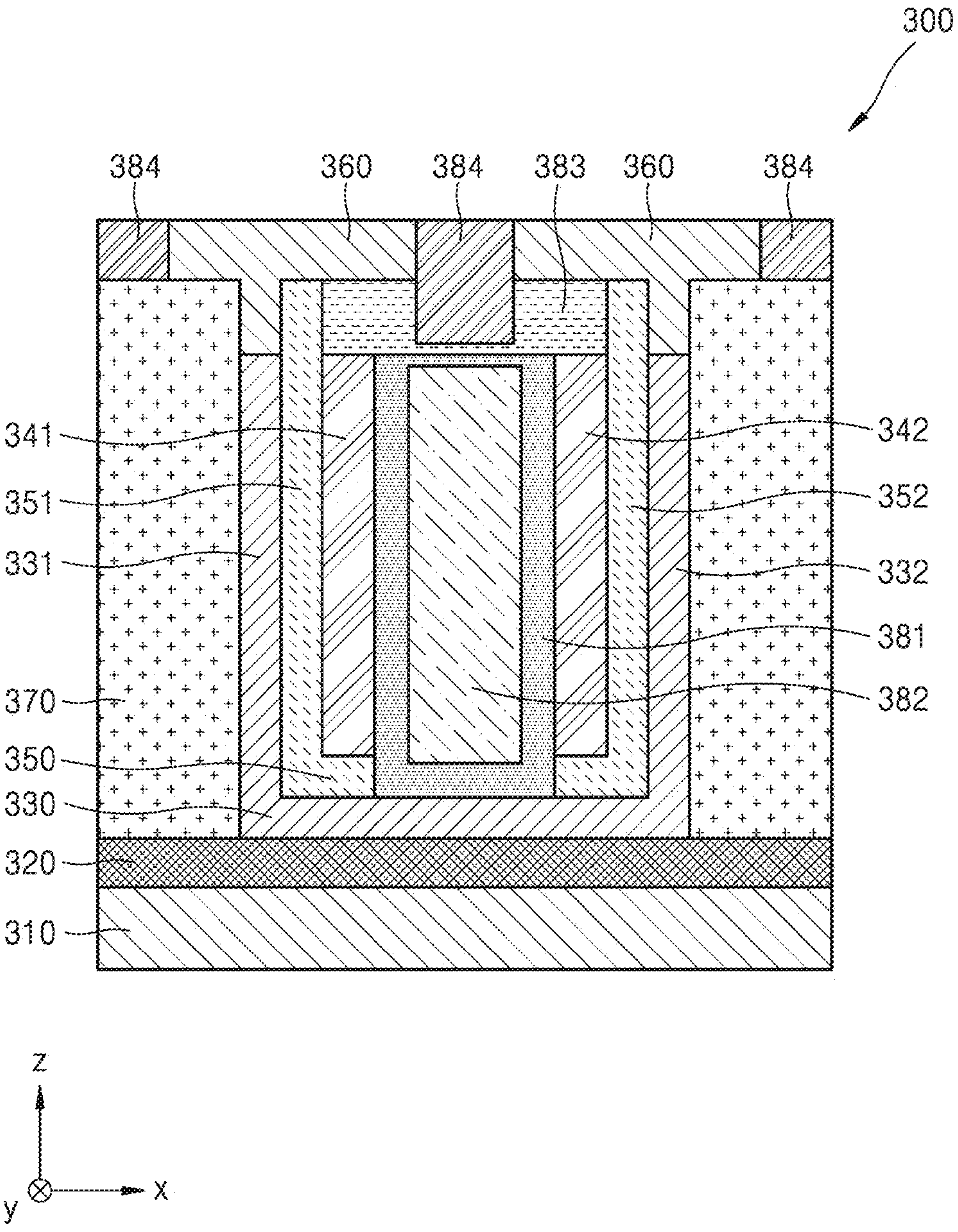
FIG. 3 is a diagram illustrating a semiconductor device according to another example embodiment.

FIG. 3 is a diagram illustrating a semiconductor device 300 according to another example embodiment.

Referring to FIG. 3, the semiconductor device 300 may include a substrate 310, a lower electrode 320, and an oxide channel 330 provided on the lower electrode 320.

The oxide channel 330 may have a U-shaped cross-sectional view. The oxide channel 330 may include a bottom portion contacting the lower electrode 320, a first vertical extension portion 331 extending from one end of the bottom portion in a direction (z direction) perpendicular to the lower electrode 320, and a second vertical extension portion 332 extending from the other end of the bottom portion in the direction (z direction) perpendicular to the lower electrode 320. The first vertical extension portion 331 and/or the second vertical extension portion 332, which are in a length direction of the oxide channel 330, may be provided perpendicularly to the substrate 310. The semiconductor device 300 may have a vertical channel transistor (VCT) structure including vertical channel regions extending in a direction z perpendicular to the substrate 310 at both ends thereof.

Here, the oxide channel 330 may be doped with an anion. The anion may include one selected from the group consisting of F (Fluorine), Cl (Chlorine), Br (Bromine), I (iodine), At (Astatine), and a combination thereof. The ion content (or mass percentage) of the portion of the oxide channel 330 that contacts the lower electrode 320 and the first vertical extension portion 331 and/or the second vertical extension portion 332 may be different. An ion mass percentage of a portion of the oxide channel 330 contacting the lower electrode 320 may be greater than an ion mass percentages of the first vertical extension portion 331 and/or the second vertical extension portion 332. For example, a portion of the oxide channel 330 contacting the lower electrode 320 may have a mass percentage greater than 10.0 wt % and less than or equal to 50.0 wt %, and the first vertical extension portion 331 and/or the second vertical extension portion 332 of the oxide channel 330 may have an ion mass percentage of greater than or equal to 0.1 wt % and less than or equal to 10.0 wt %.

Further, In, Ga, and Zn of the oxide channel 330 that may have atomic ratios that may increase reliability of the semiconductor device. An atomic ratio of In among materials constituting the thin film of the oxide channel 330 may be 55 at % or less. An atomic ratio of In among materials constituting the thin film of the oxide channel 330 may be 5 at % or more. In some example embodiments, an atomic ratio of In among materials constituting the thin film of the oxide channel 130 may be about 5 at % to 55 at %. An atomic ratio of Ga among materials constituting the thin film of the oxide channel 330 may be 30 at % or more. An atomic ratio of Ga among the materials constituting the thin film of the oxide channel 330 may be 95 at % or less in the case of a binary system, and may be 90% or less in the case of a ternary system. In some example embodiments, an atomic ratio of Ga among materials constituting the thin film of the oxide channel 330 may be about 30 at % to 45 at %.

A first gate electrode 341 may be separated from the first vertical extension portion 331, and a second gate electrode 342 may be separated from the second vertical extension portion 332. A first gate insulator 351 may be provided between the first vertical extension portion 331 and the first gate electrode 341, and a second gate insulator 352 may be provided between the second vertical extension portion 332 and the second gate electrode 342.

The first gate electrode 341 and/or the second gate electrode 342 may extend in a second horizontal direction (y). The first gate electrode 341 and the second gate electrode 342 may be spaced apart from each other. The first gate electrode 341 and/or the second gate electrode 342 may form a word line WL. An electrical signal input to the first gate electrode 341 may not match an electrical signal input to the second gate electrode 342. The first gate electrode 341 may control a channel of the first vertical extension portion 331, and the second gate electrode 342 may control a channel of the second vertical extension portion 332.

An insulating liner 381 may be disposed between the first gate electrode 341 and the second gate electrode 342 that are spaced apart from each other. The insulating liner 381 may be conformally disposed on sidewalls of the first gate electrode 341 and the second gate electrode 342 that face each other and/or on an upper surface of the oxide channel 330. The insulating liner 381 may have an upper surface disposed on the same plane as the first gate electrode 341 and the second gate electrode 342. The insulating liner 381 may include, for example, silicon nitride. A buried insulating layer 382 may fill a space between the first gate electrode 341 and the second gate electrode 342 that are on the insulating liner 381 and spaced apart from each other. The buried insulating layer 382 may include, for example, silicon oxide. An upper insulating layer 383 may be disposed on upper surfaces of the first gate electrode 341, the second gate electrode 342, and/or the buried insulating layer 382. An upper surface of the upper insulating layer 383 may be disposed at the same level as an upper surface of the mold insulator 370.

An upper electrode 360 may be disposed above the oxide channel 330. The upper electrode 360 may serve as a landing pad. The upper electrode 360 may include an upper left electrode and an upper right electrode. The upper left electrode may be electrically connected to the first vertical extension portion 331. The upper right electrode may be electrically connected to the second vertical extension portion 332. The upper left electrode and the upper right electrode may not be electrically connected with each other. The upper electrode 360 may include an upper portion and a lower portion. An upper portion of the upper electrode 360 may be a portion of the upper electrode 360 disposed at a level higher than the upper surface of the mold insulator 370. A lower portion of the upper electrode 360 may be a portion of the upper electrode 360 disposed inside an upper electrode recess defined between the mold insulator 370 and the upper insulating layer 383. In one example embodiment, the upper portion of the upper electrode 360 may have a first width w1 in the first horizontal direction (x), and the lower portion of the upper electrode 360 may have a second width w2 smaller than the first width w1 in the first horizontal direction (x). The lower portion of the upper electrode 360 is disposed inside the upper electrode recess, and the upper portion of the upper electrode 360 may have a bottom surface disposed on the upper surface of the mold insulator 370 and the upper surface of the upper insulating layer 383. Accordingly, the upper electrode 360 may have a T-shaped vertical cross-section. A bottom surface of the lower portion of the upper electrode 360 may contact upper surfaces of the first vertical extension part 331 and/or the second vertical extension part 332. Both sidewalls of the lower portion of the upper electrode 360 may be aligned with both sidewalls of the first vertical extension portion 331 or the second vertical extension portion 332. A bottom surface of the lower portion of the upper electrode 360 may be disposed at a higher level than upper surfaces of the first gate electrode 341 and/or the second gate electrode 342, and a sidewall of the lower portion of the upper electrode 360 may be covered by the first gate insulator 351 and/or the second gate insulator 352. An upper electrode insulating layer 384 surrounding the upper electrode 360 may be disposed on upper surfaces of the mold insulating material 370 and the upper insulating layer 383.

Next, a method of manufacturing a semiconductor device according to an example embodiment will be described with reference to FIGS. 4 to 10.

Figure 4:
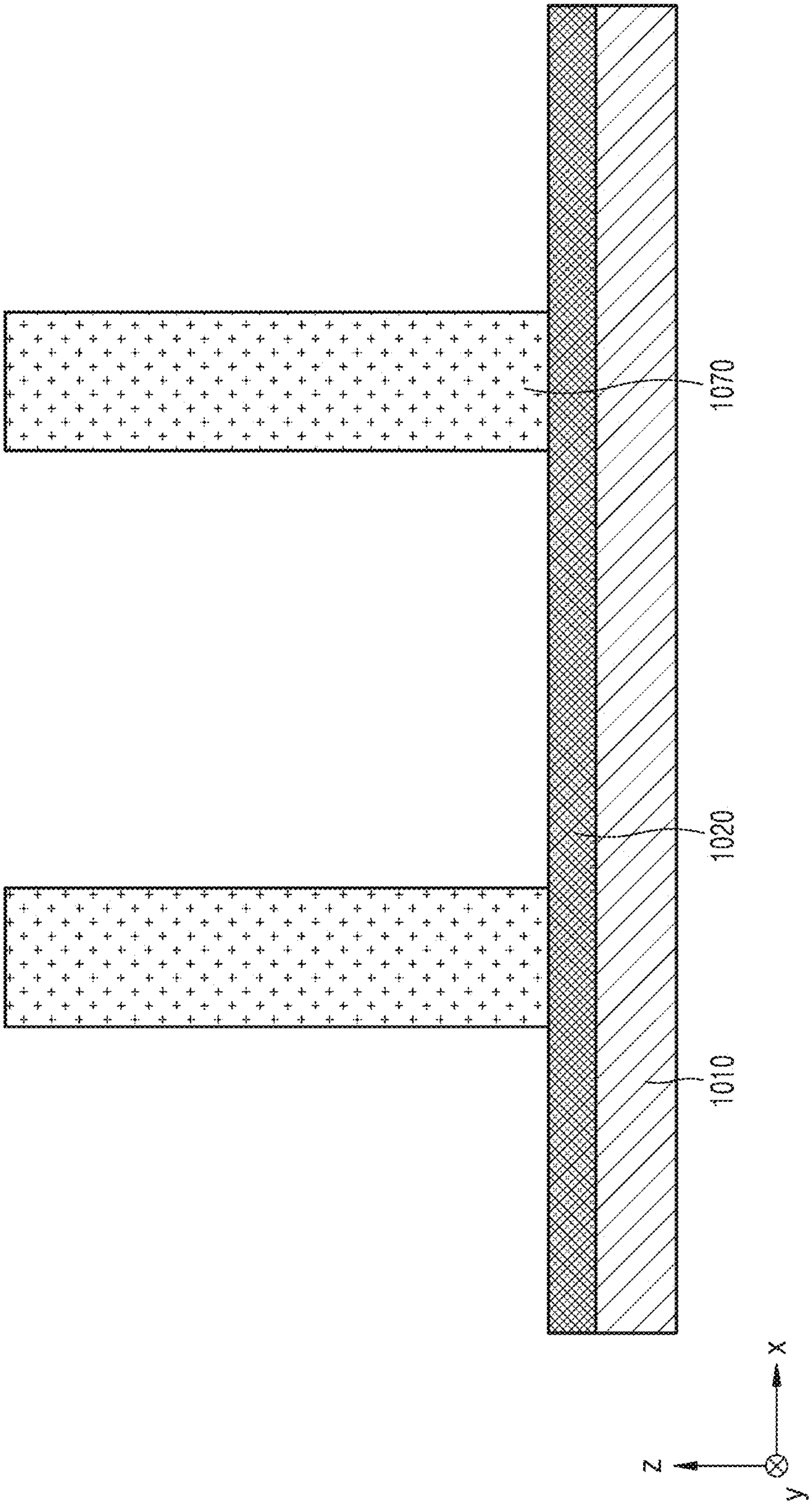
FIGS. 4 to 11 are diagrams for explaining a method of manufacturing a semiconductor device according to an example embodiment.

Referring to FIG. 4, a plurality of mold insulators 1070 extending in the second horizontal direction (y) may be deposited on a lower electrode 1020 extending in the first horizontal direction (x). The mold insulator 1070 may be stacked until it has a desired or predetermined height in the vertical direction (z). The plurality of mold insulators 1070 and the lower electrode 1020 may form openings.

Figure 5:
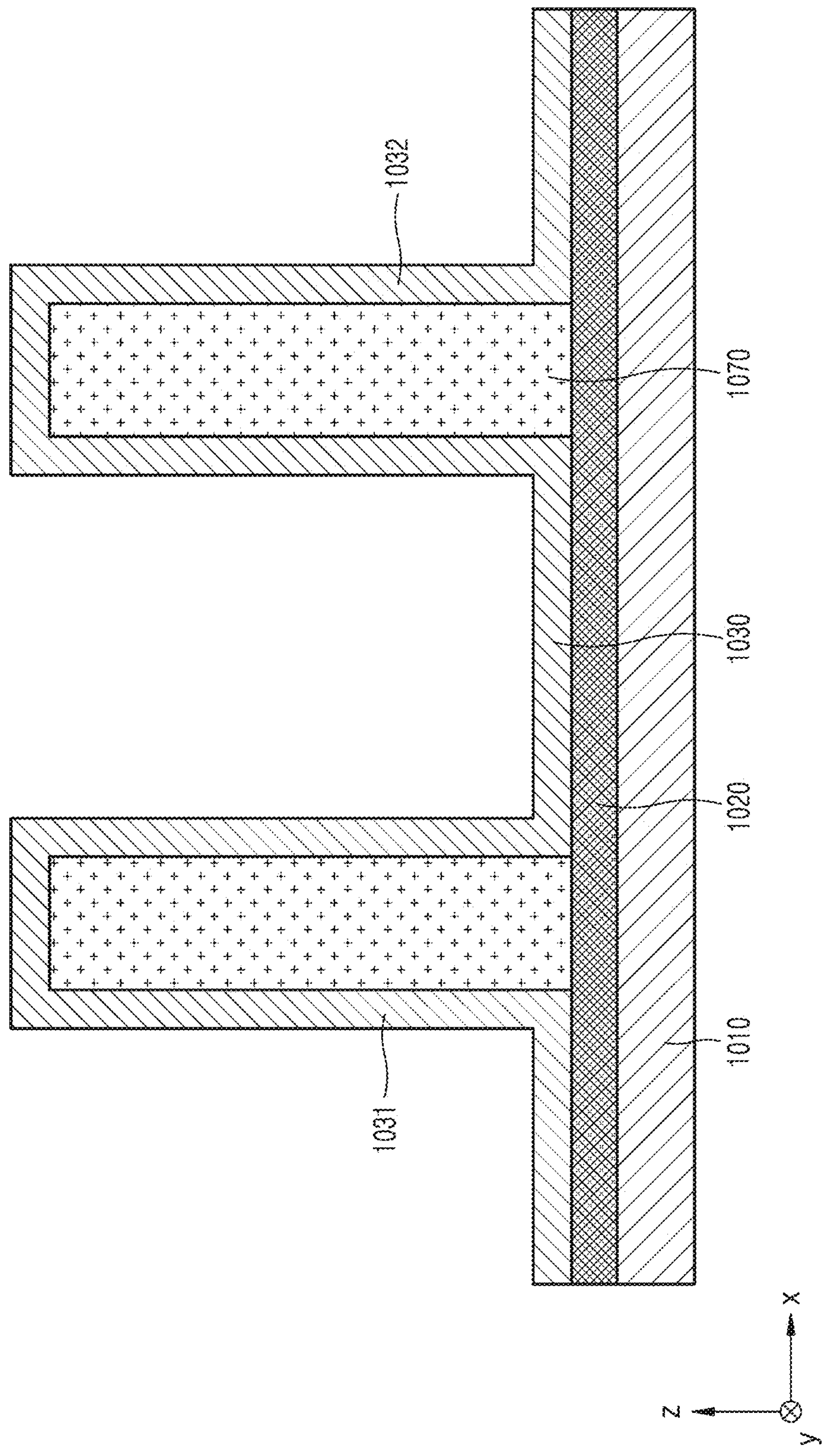
Figure 6:
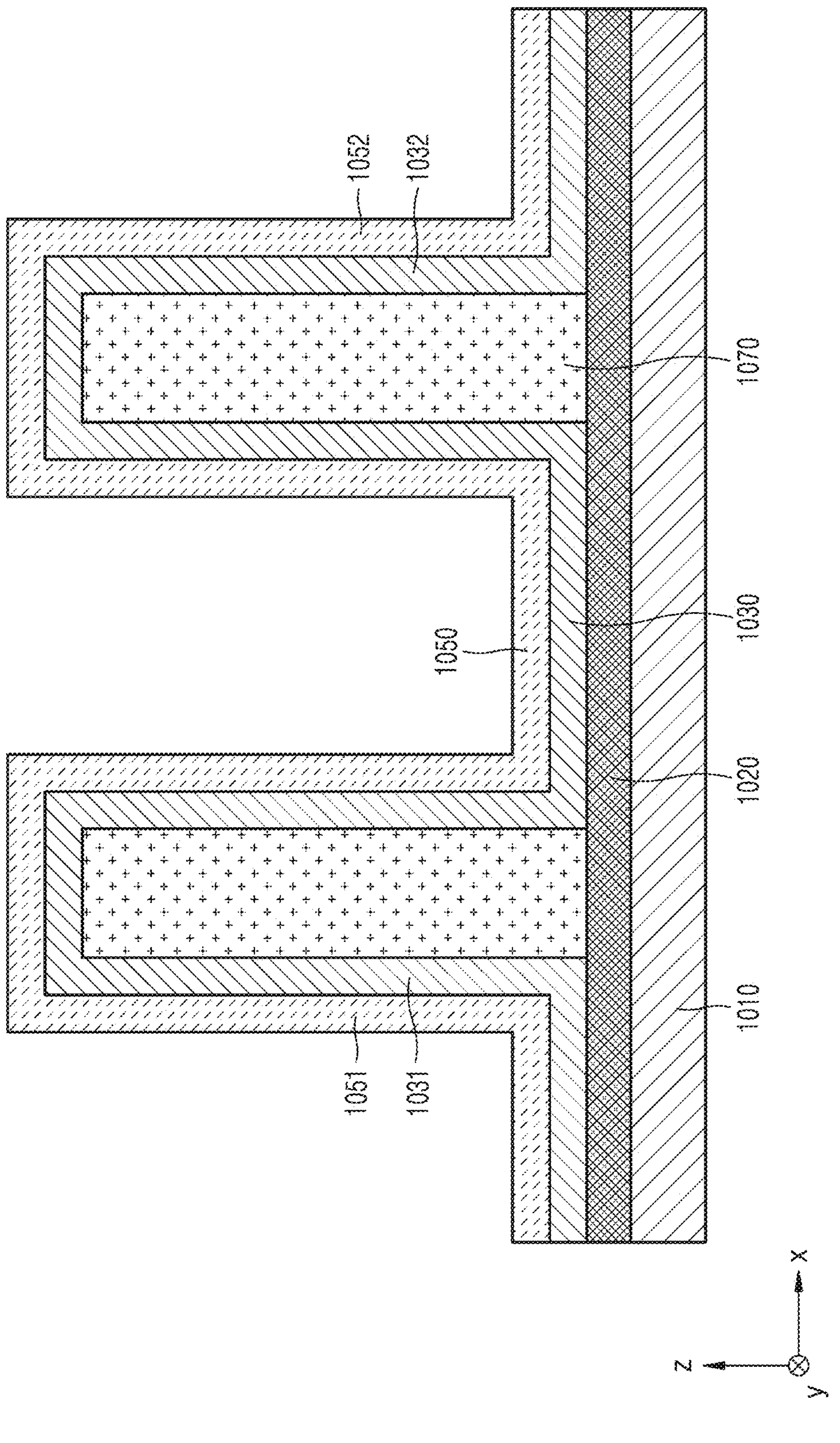
Figure 7:
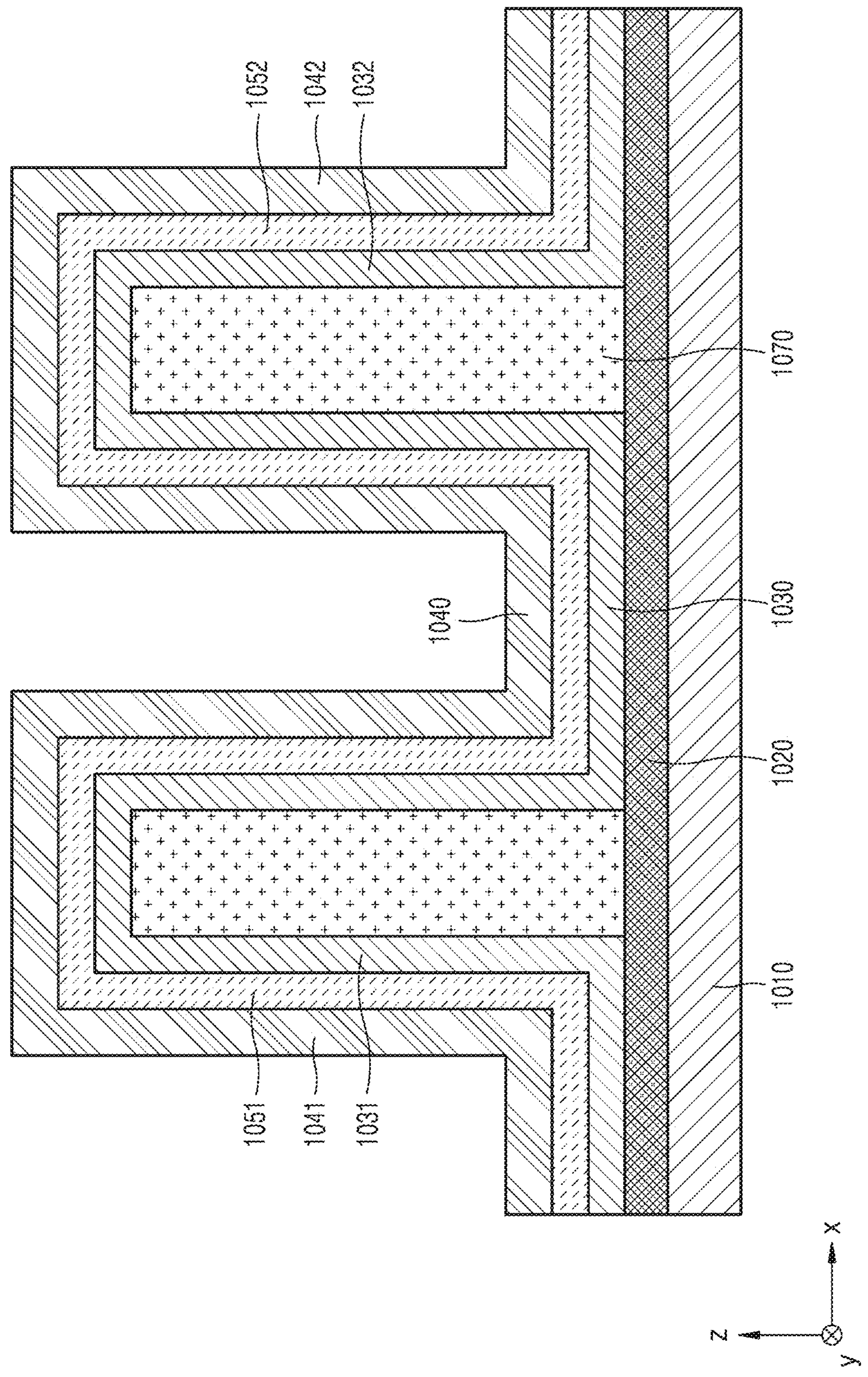

Referring to FIG. 5, an oxide channel 1030 may be deposited on the lower electrode 1020 and the mold insulator 1070. The lower electrode 1020, the plurality of mold insulators 1070, and/or the oxide channel 1030 may form a stack structure. The oxide channel 1030 may be deposited by using a sputtering method, a thermal-ALD method, or a PE-ALD method. The oxide channel 1030 may include a first vertical extension portion 1031 and/or a second vertical extension portion 1032, and may have a U-shaped cross-sectional view. Referring to FIG. 6, a gate insulator 1050 may be deposited on a surface of the oxide channel 1030. The gate insulator 1050 may include a first gate insulator 1051 and/or a second gate insulator 1052 extending in a direction (z) perpendicular to a substrate 1010 at both ends thereof. Referring to FIG. 7, a gate electrode 1040 may be stacked on a surface of the gate insulator 1050. The gate electrode 1040 may include a first gate electrode 1041 and/or a second gate electrode 1042 extending in a direction (z) perpendicular to the substrate 1010 at both ends thereof.

Figure 8:
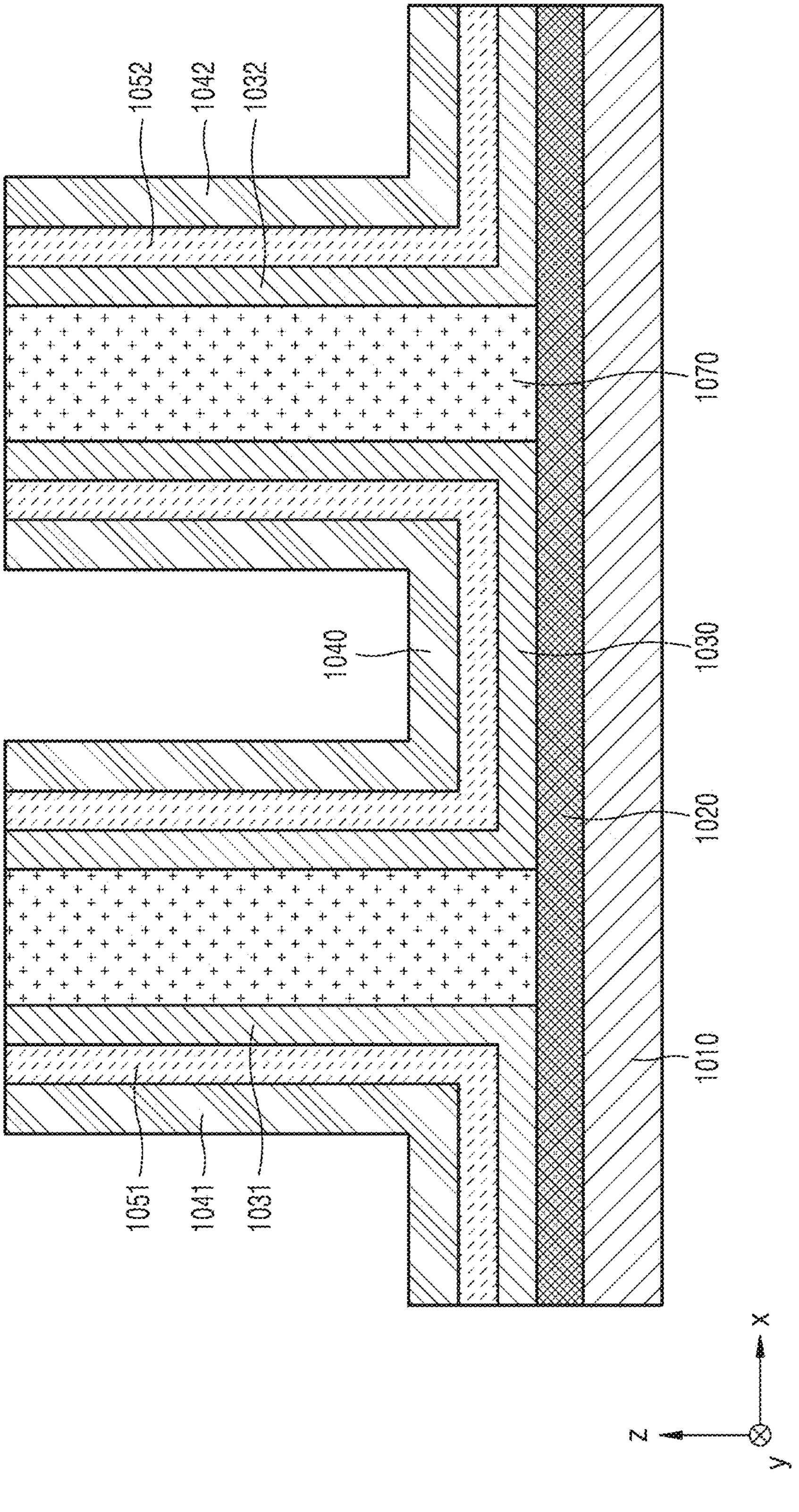

Referring to FIG. 8, anisotropic etching may be performed from an upper portion of the gate electrode 1040 of the structure shown in FIG. 7. The gate electrode 1040, the gate insulator 1050, and the oxide channel 1030 may be etched from above to expose an upper surface of the mold insulator 1070. In this way, the gate electrode 1040 is separated into the first gate electrode 1041 and the second gate electrode 1042, and the gate insulator 1050 is separated into the first gate insulator 1051 and the second gate insulator 1052. Further, the gate electrode 1040, the gate insulator 1050, and the oxide channel 1030 above the mold insulator 1070 may be etched, and thus, the upper surface of the mold insulator 1070 may be exposed. A level of the upper surface of the mold insulator 1070, upper surfaces of the first gate electrode 1041 and the second gate electrode 1042, and upper surfaces of the first gate insulator 1051 and the second gate insulator 1052 may match. When the gate electrode 1040 is etched once more, an upper surface level of the first gate electrode 1041 and the second gate electrode 1042 may be lower than the mold insulator 1070, upper surface levels of the first vertical extension portion 1031 and the second vertical extension portion 1032, and upper surface levels of the first gate insulator 1051 and the second gate insulator 1052.

The mold insulator 1070, the first vertical extension portion 1031 of the oxide channel 1030, the first gate insulator 1051 of the gate insulator 1050, and/or the first gate electrode 1041 may be sequentially stacked without any intervening layers. The mold insulator 1070, the second vertical extension portion 1032 of the oxide channel 1030, the second gate insulator 1052 of the gate insulator 1050, and/or the second gate electrode 1042 may be sequentially stacked without any intervening layers.

The gate electrode 1040 and the gate insulator 1050 may be etched in a direction toward a bottom of the opening, and thus, an upper surface of the oxide channel 1030 may be partially exposed.

Figure 9:
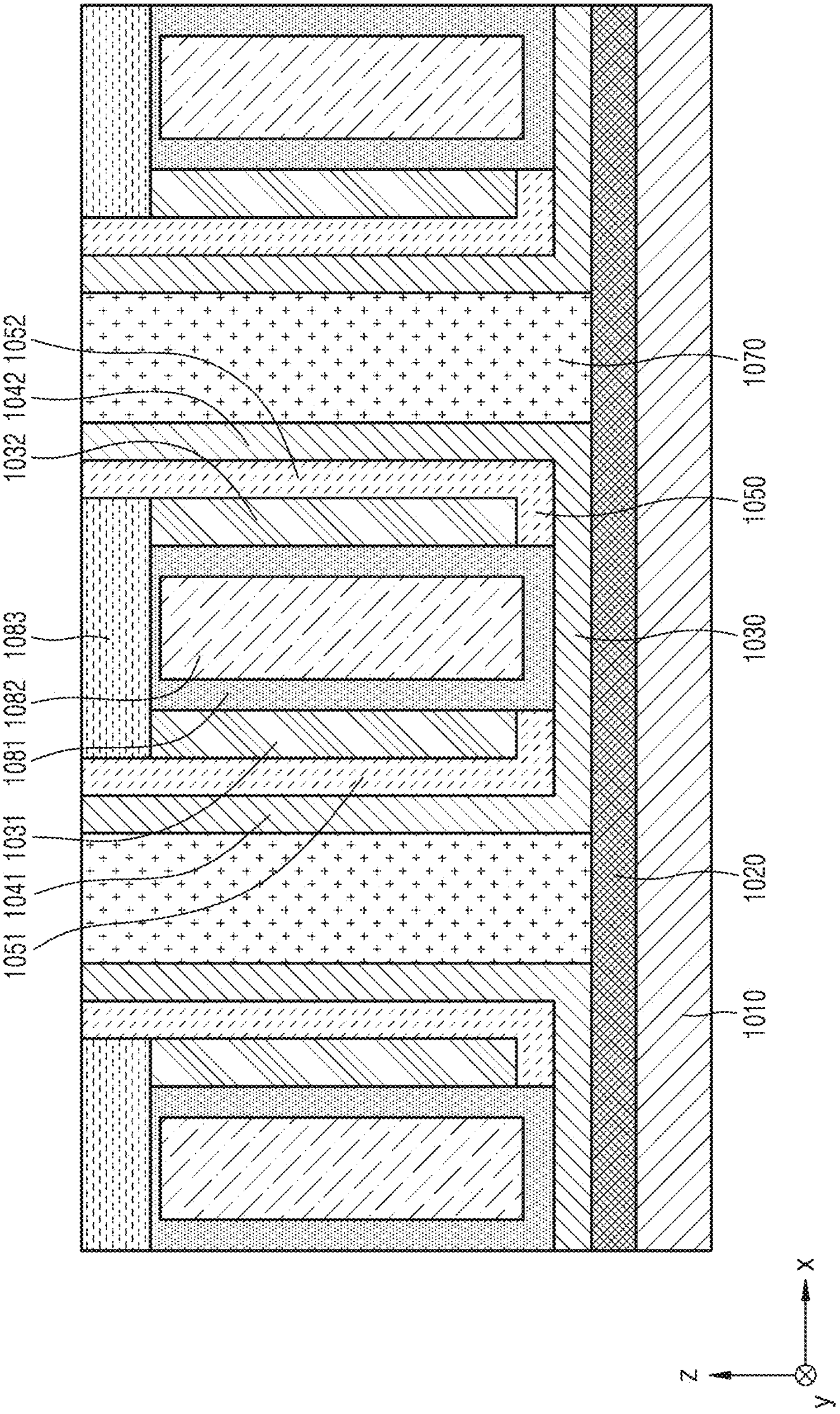

Referring to FIG. 9, an insulating liner 1081 may be deposited from a bottom surface of the oxide channel 1030 to an upper surface level of the first gate electrode 1041 and/or the second gate electrode 1042. An upper insulating layer 1083 may be deposited on upper surfaces of the first gate electrode 1041 and/or the second gate electrode 1042 and an upper surface of the insulating liner 1081. The upper insulating liner 1081 and the buried insulating layer 1082 may not be distinguished. A surface level of the upper insulating layer 1083 may match an upper surface of the mold insulator 1070, upper surfaces of the first vertical extension portion 1031 and the second vertical extension portion 1032, upper surface levels of the first gate insulator 1051 and the second gate insulator 1052, and/or upper surfaces of the first gate electrode 1041 and the second gate electrode 1042.

Figure 10:
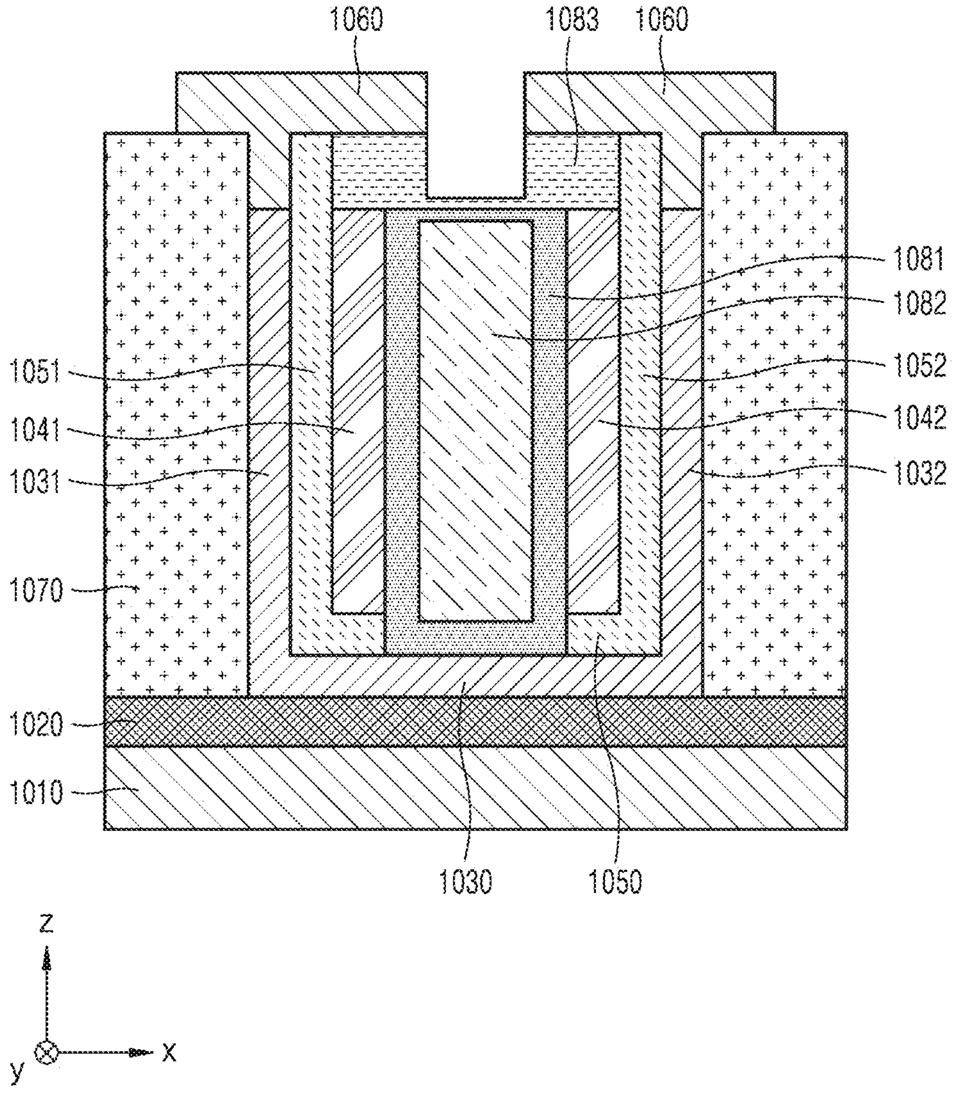

Referring to FIG. 10, upper portions of the first vertical extension portion 1031 and the second vertical extension portion 1032 may be etched, and an upper electrode 1060 may be deposited on the first vertical extension portion 1031 and the second vertical extension portion 1032. After the upper electrode 1060 is deposited, a central portion of the upper electrode 1060 and an upper portion of the upper insulating layer 1083 may be partially etched.

Figure 11:
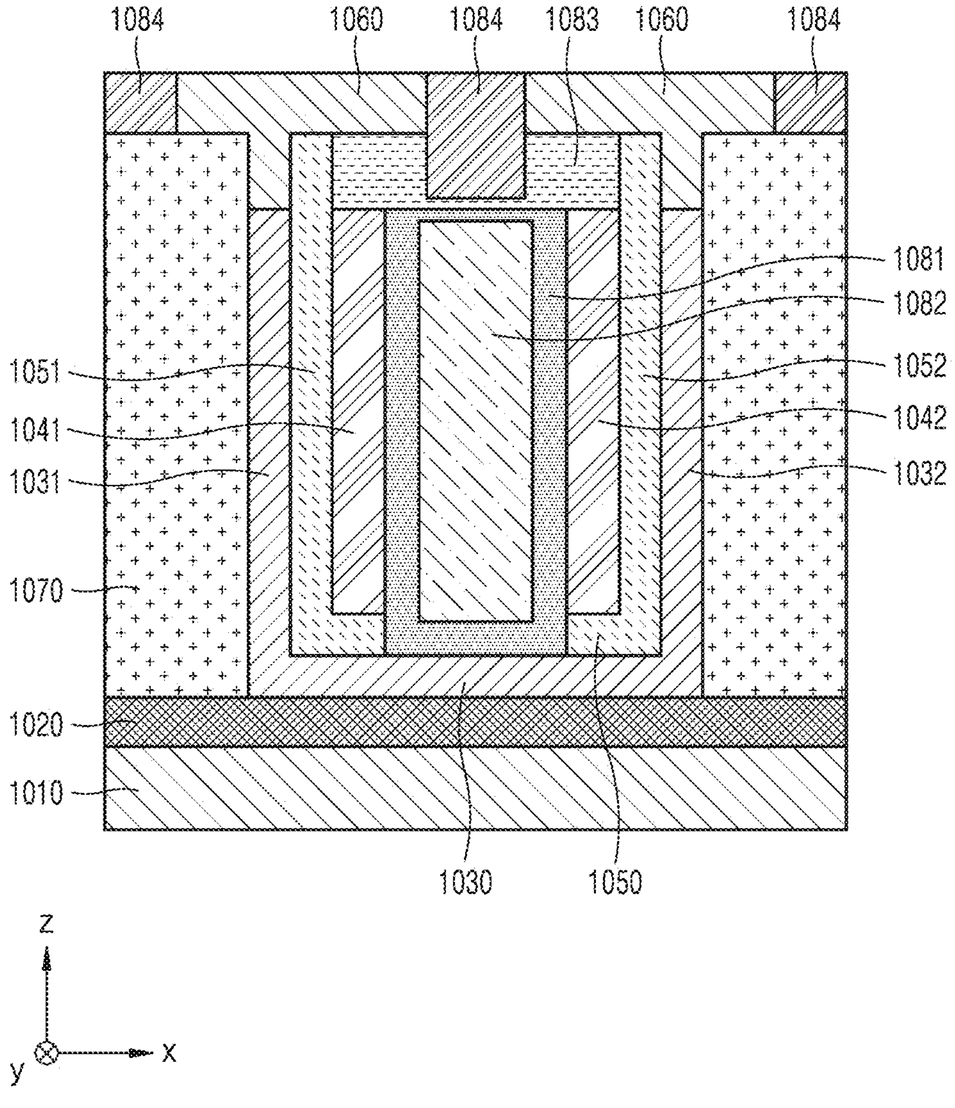

Referring to FIG. 11, an upper electrode insulating layer 1084 may cover between the upper electrodes 1060 and an upper portion of the upper insulating layer 1083. An upper surface level of the upper electrode insulating layer 1084 and an upper surface level of the upper electrode 1060 may match.

Figure 12:
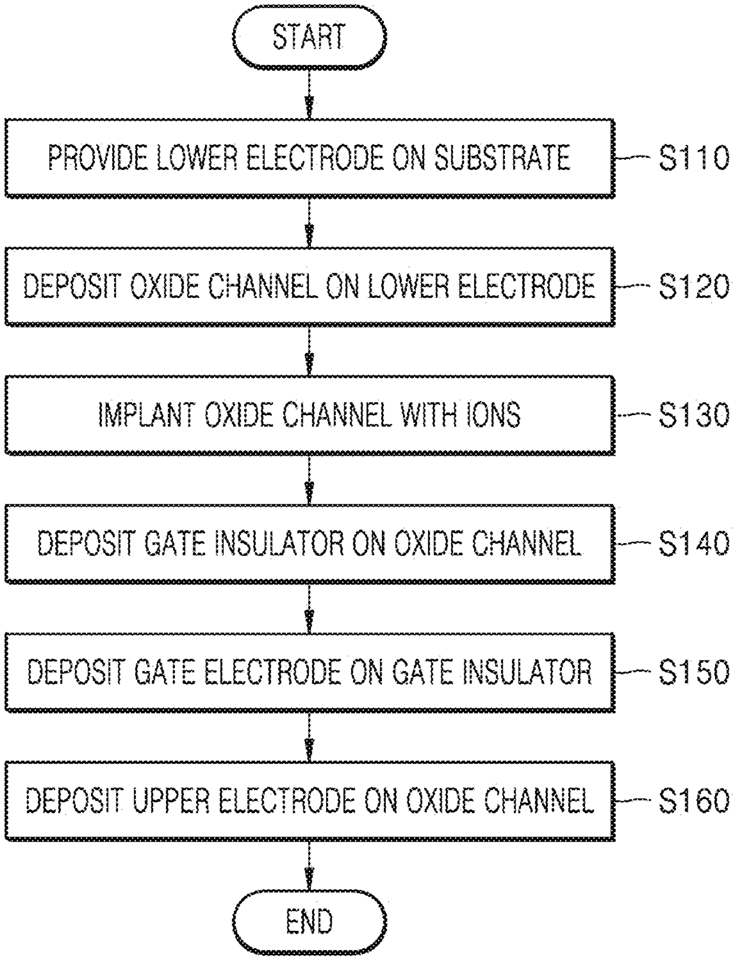
FIG. 12 is a flowchart illustrating a method of manufacturing a semiconductor device according to an example embodiment.

FIG. 12 is a flowchart illustrating a method of manufacturing a semiconductor device according to an example embodiment.

Referring to FIG. 12, the method of manufacturing a semiconductor device according to an example embodiment may include disposing a lower electrode 1020 on a substrate 1010 (S110), depositing an oxide channel 1030 on the lower electrode (S120), doping ions into the oxide channel 1030 (S130), depositing a gate insulator 1050 on the oxide channel 1030 (S140), depositing a gate electrode 1040 on the gate insulator 1050 (S150), and depositing an upper electrode 1060 on the oxide channel 1030 (S160).

Figure 13:
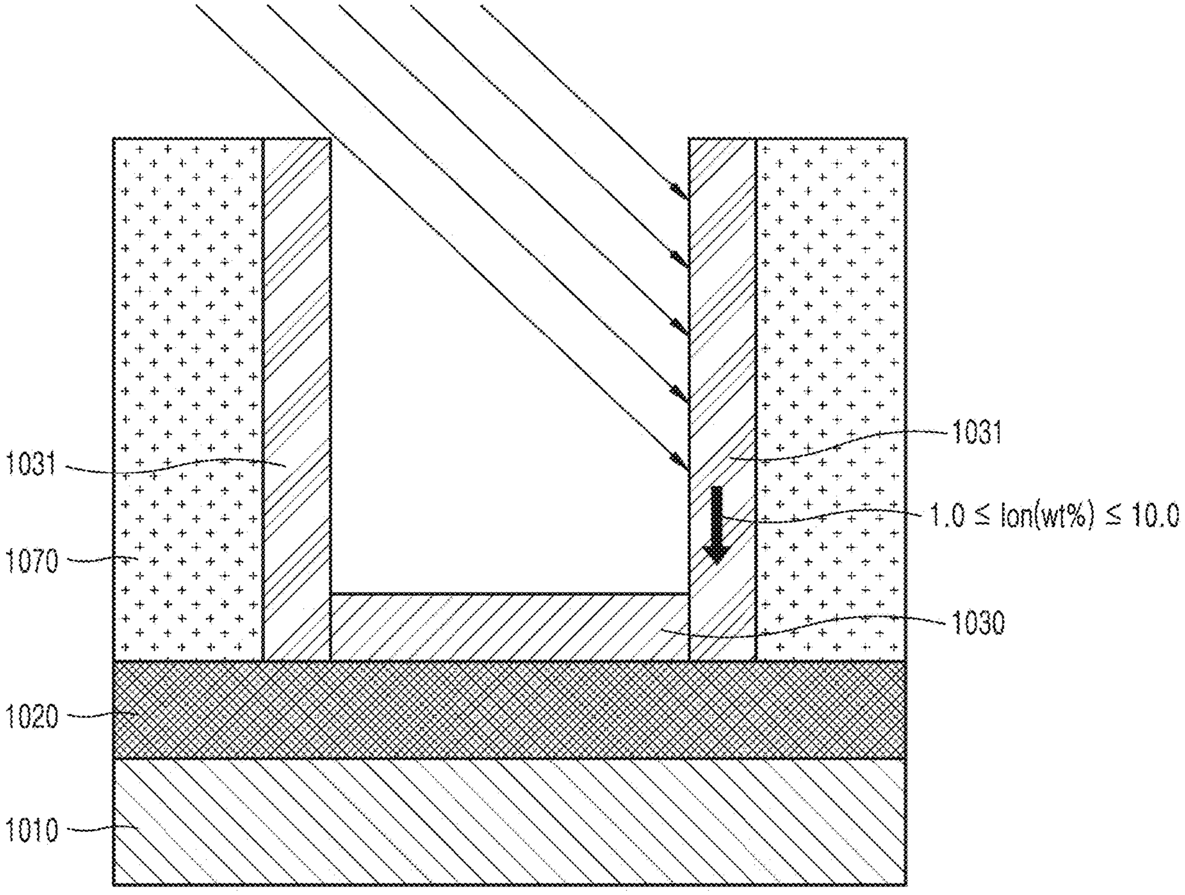
FIGS. 13 to 14 are diagrams illustrating an ion implantation operation in a method of manufacturing a semiconductor device according to an example embodiment.
Figure 14:
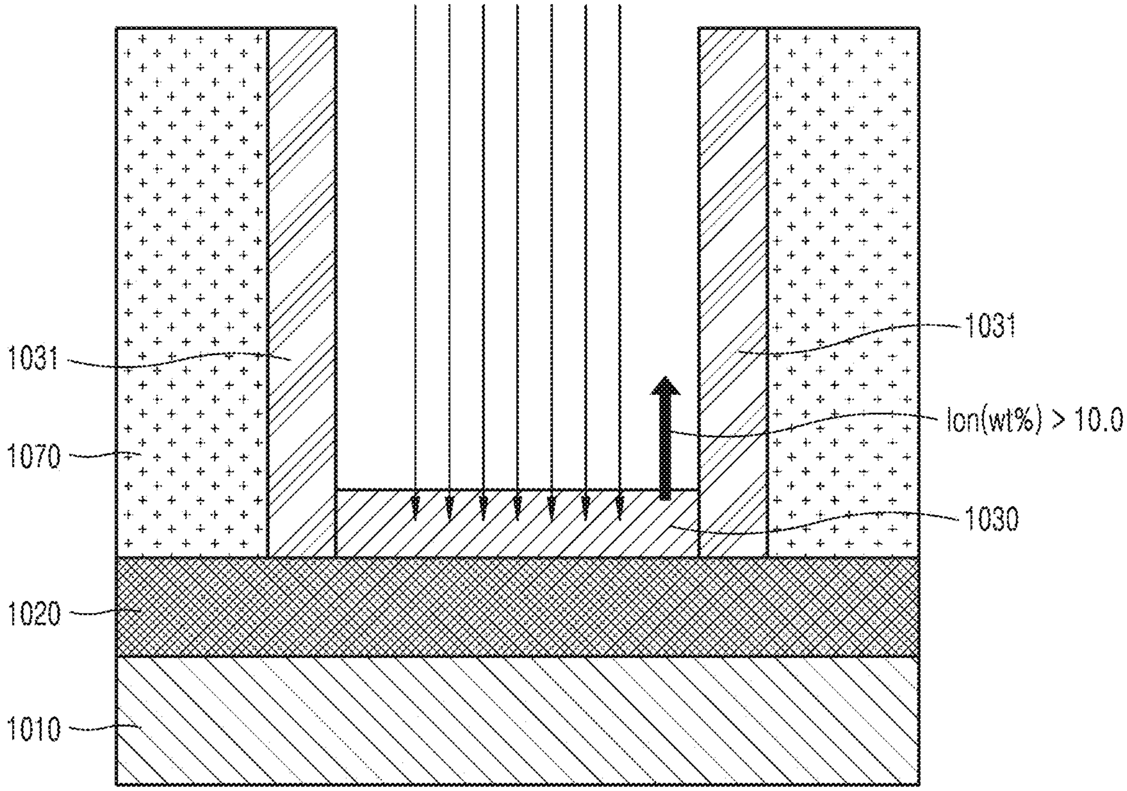

FIGS. 13 to 14 are diagrams illustrating an operation of doping ions in the method of manufacturing a semiconductor device according to an example embodiment.

Referring to FIG. 13, the first vertical extension portion 1031 and/or the second vertical extension portion 1032 of the oxide channel 1030 may be doped with ions, and a lower portion of the oxide channel 1030 in contact with the electrode 1020 may be maintained at an oxygen vacancy. For example, the first vertical extension portion 1031 and/or the second vertical extension portion 1032 may be doped with ions of 0.1 to 10.0 wt %.

Referring to FIG. 14, an excessive amount of ions may be implanted into the lower portion of the oxide channel 1030 that contacts the lower electrode 1020. The lower portion of the oxide channel 1030 contacting the lower electrode 1020 may be doped with ions, for example, of greater than about 10.0 wt % and less than about 50.0 wt %. Conductivity may be increased and contact resistance may be reduced by doping an excessive amount of ions into the portion of the oxide channel 1030 that contacts the lower electrode 1020.

Oxygen vacancies generated in the thin film during a high-temperature process may be reduced and thermal and/or electrical reliability may be improved by differentiating the ion mass percentage of the region of the oxide channel 1030 that contacts the lower electrode 1020 and other regions.

Because a semiconductor device according to an example embodiment has an ultra-small size and excellent electrical performance, it is appropriate to be applied to an integrated circuit device having a high degree of integration. Further, a semiconductor device according to an example embodiment may be configured to a transistor constituting a digital circuit or an analog circuit. In some example embodiments, a semiconductor device according to an example embodiment may be used as a high voltage transistor or a low voltage transistor. For example, a semiconductor device according to an example embodiment may constitute a flash memory device, which is a non-volatile memory device operating at a high voltage or a high voltage transistor constituting a peripheral circuit of an electrically erasable and programmable read only memory (EEPROM) device. In some example embodiments, a semiconductor device according to an example embodiment may configure a transistor included in an IC chip used for a liquid crystal display (LCD) or an IC chip used in LED display devices or micro LED display devices.

Figure 15:
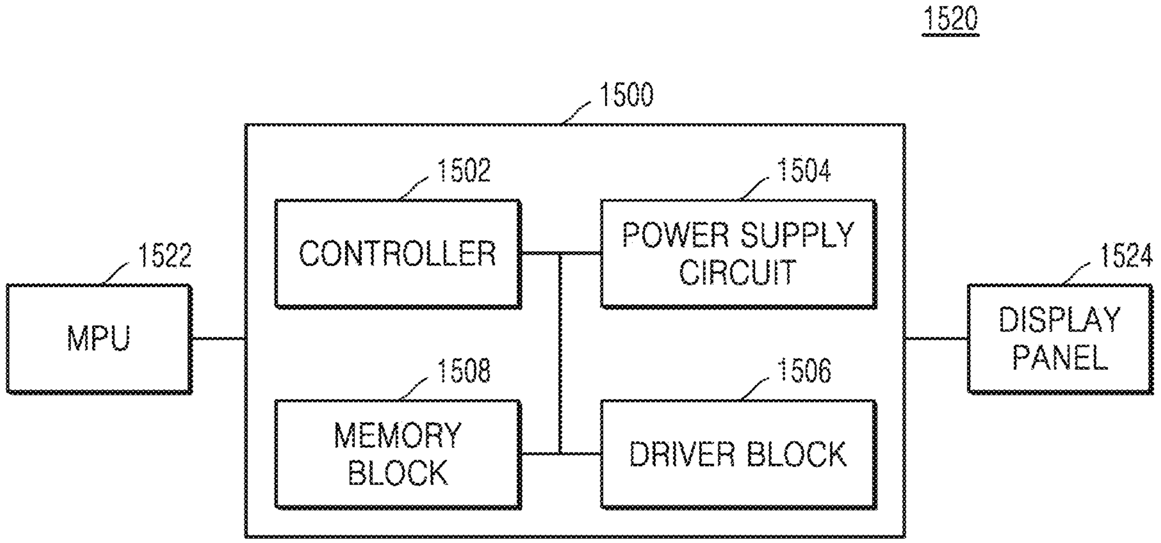
FIG. 15 is a schematic block diagram of a display device including a display driver IC (DDI) and a semiconductor device including the DDI according to an example embodiment.

FIG. 15 is a schematic block diagram of a display driver IC (DDI) 1500 and a display device 1520 including the DDI 1500 according to an example embodiment.

Referring to FIG. 15, the DDI 1500 may include a controller 1502, a power supply circuit 1504, a driver block 1506, and a memory block 1508. The controller 1502 may receive and decode a command applied from a main processing unit (MPU) 1522, and control each block of the DDI 1500 to implement an operation according to the command. The power supply circuit 1504 may generate a driving voltage in response to the control of the controller 1502. The driver block 1506 may drive a display panel 1524 using the driving voltage generated by the power supply circuit 1504 in response to the control of the controller 1502. The display panel 1524 may be a liquid crystal display panel or a micro LED device. The memory block 1508 may be a block that temporarily stores commands input to the controller 1502 or control signals output from the controller 502 or stores necessary or desired data. The memory bock 1508 may include memories, such as RAM and ROM. The power supply circuit 1504 and the driver block 1506 may include the semiconductor device according to one of the example embodiments described above with reference to FIGS. 1 to 14.

Figure 16:
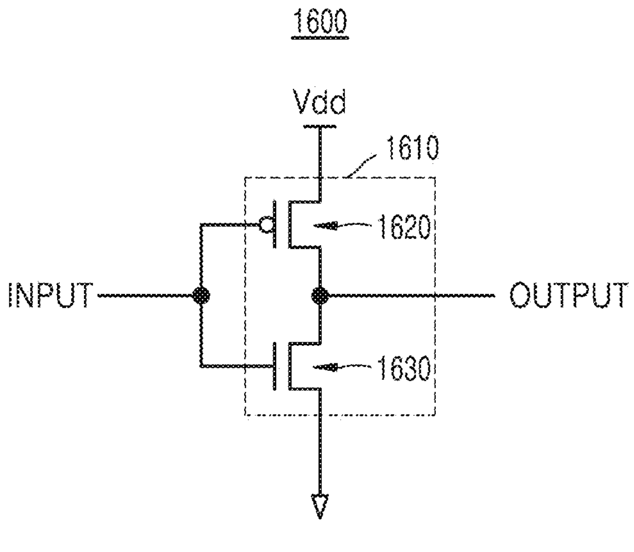
FIG. 16 is a circuit diagram of a CMOS inverter including a semiconductor device according to an example embodiment.

FIG. 16 is a circuit diagram of a CMOS inverter according to an example embodiment.

The CMOS inverter 1600 includes a CMOS transistor 1610. The CMOS transistor 1610 includes a PMOS transistor 1620 and an NMOS transistor 1630 connected between a power terminal Vdd and a ground terminal. The CMOS transistor 1610 may include the semiconductor device according to one of the example embodiments described above with reference to FIGS. 1 to 14.

Figure 17:
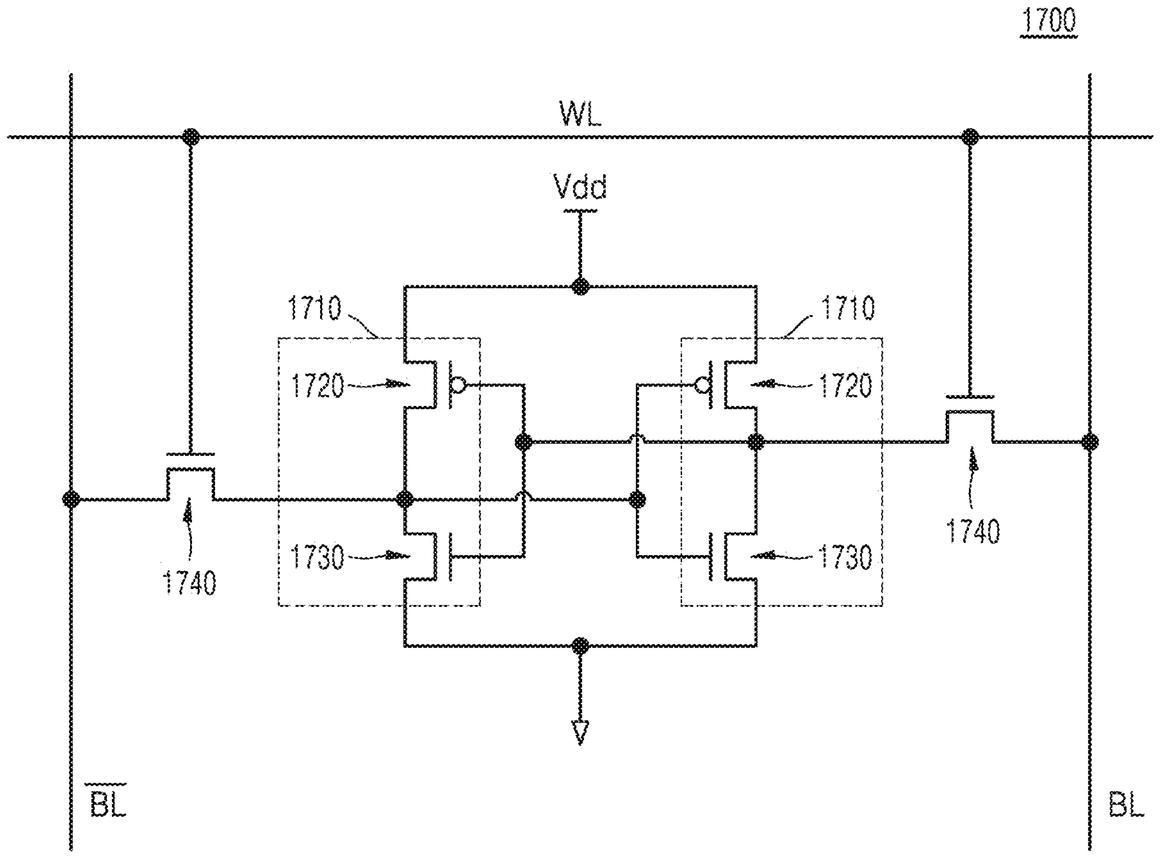
FIG. 17 is a circuit diagram of a CMOS SRAM device including a semiconductor device according to an example embodiment.

FIG. 17 is a circuit diagram of a CMOS SRAM device 1700 according to an example embodiment.

The CMOS SRAM device 1700 includes a pair of driving transistors 1710. The pair of driving transistors 1710 includes a PMOS transistor 1720 and an NMOS transistor 1730 connected between a power terminal Vdd and a ground terminal, respectively. The CMOS SRAM device 1700 may further include a pair of transfer transistors 1740. A source of the transfer transistor 1740 is cross-connected to a common node of the PMOS transistor 1720 (e.g., a gate of the PMOS transistor 1720) and the NMOS transistor 1730 (e.g., a gate of the NMOS transistor 1730) constituting the driving transistor 1710. A power terminal VDD is connected to a source of the PMOS transistor 1720 and a ground terminal is connected to a source of the NMOS transistor 1730. A word line WL may be connected to a gate of the pair of transfer transistors 1740, and a bit line BL and an inverted bit line may be connected to drains of the pair of transfer transistors 740, respectively.

At least one of the driving transistor 1710 and the transfer transistor 1740 of the CMOS SRAM device 1700 may include the semiconductor device according to one of the example embodiments described above with reference to FIGS. 1 to 14.

Figure 18:
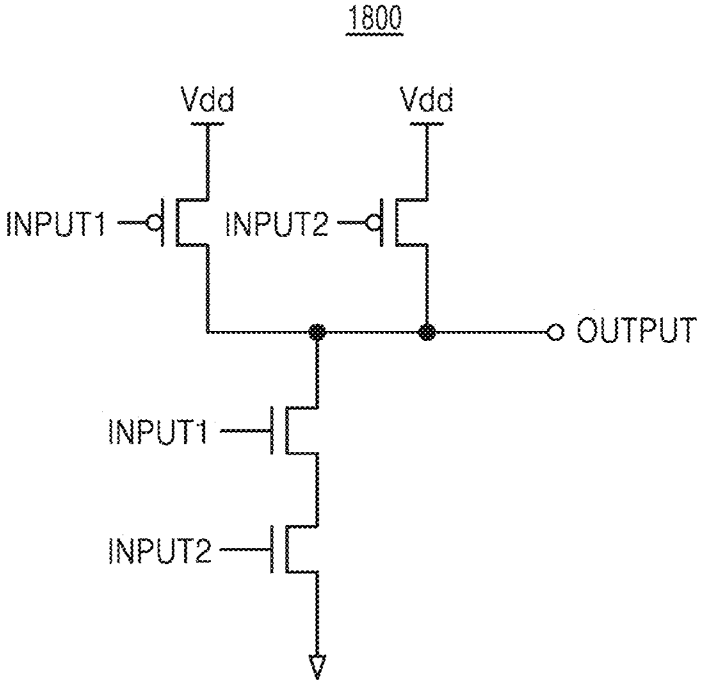
FIG. 18 is a circuit diagram of a CMOS NAND circuit including a semiconductor device according to an example embodiment.

FIG. 18 is a circuit diagram of a CMOS NAND circuit 1800 according to an example embodiment.

The CMOS NAND circuit 1800 includes a pair of CMOS transistors to which different input signals are transmitted. The CMOS NAND circuit 1800 may include the semiconductor device according to one of the example embodiments described above with reference to FIGS. 1 to 14.

Figure 19:
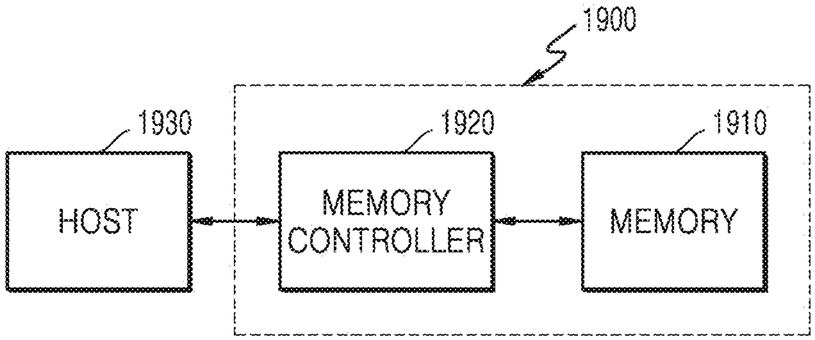
FIG. 19 is a block diagram of an electronic system including a semiconductor device according to an example embodiment.

FIG. 19 is a block diagram illustrating an electronic system 1900 according to an example embodiment.

The electronic system 1900 includes a memory 1910 and a memory controller 1920. The memory controller 1920 may control the memory 1910 to read data from the memory 1910 and/or write data to the memory 1910 in response to a request from a host 1930. At least one of the memory 1910 and the memory controller 1920 may include the semiconductor device according to one of the example embodiments described above with reference to FIGS. 1 to 14.

Figure 20:
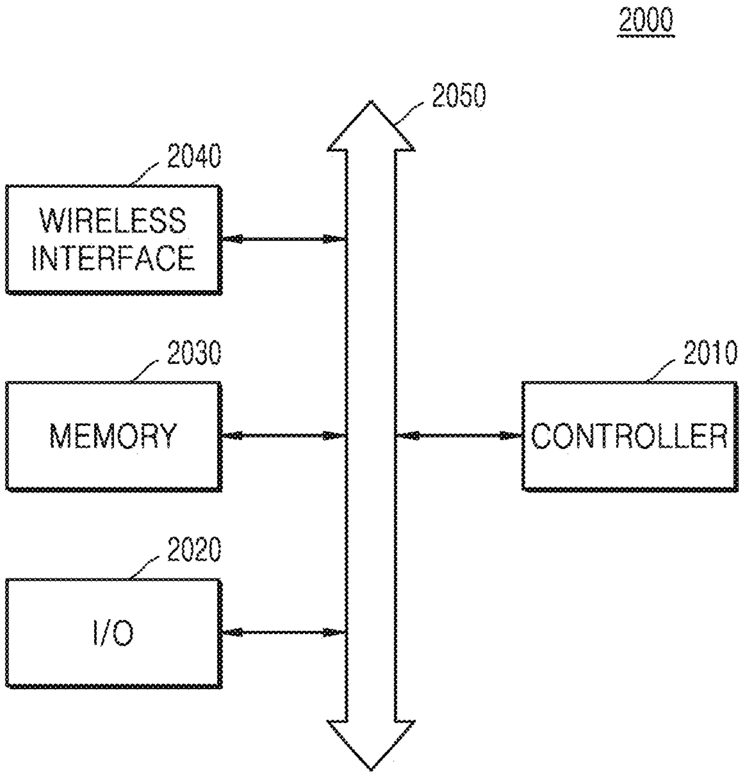
FIG. 20 is a block diagram of an electronic system including a semiconductor device according to an example embodiment.

FIG. 20 is a block diagram of an electronic system 2000 according to an example embodiment.

The electronic system 2000 may configure a wireless communication device or a device capable of transmitting and/or receiving information in a wireless environment. The electronic system 2000 includes a controller 2010, an input/output device (I/O) 2020, a memory 2030, and a wireless interface 2040, which are interconnected through a bus 2050, respectively.

The controller 2010 may include at least one of a microprocessor, a digital signal processor, or a processing device similar thereto. The input/output device 2020 may include at least one of a keypad, a keyboard, or a display. The memory 2030 may be used to store commands executed by controller 2010. For example, the memory 2030 may be used to store user data. The electronic system 2000 may use a wireless interface 2040 to transmit/receive data over a wireless communication network. The wireless interface 2040 may include an antenna and/or a wireless transceiver. The electronic system 1000 may include the semiconductor device according to one of the example embodiments described above with reference to FIGS. 1 to 14.

Semiconductor devices and/or manufacturing methods thereof according to some example embodiments may suppress side reactions and interfacial composition separation phenomena induced during semiconductor deposition. In addition, an improved contact characteristic may be provided and ion deterioration may be mitigated or prevented.

In a semiconductor device according to an example embodiment, an oxide channel may be doped with ions to secure a shape of an oxide semiconductor thin film and/or structural stability of a transistor. Also, in the method of manufacturing a semiconductor device according to an example embodiment, a semiconductor device having the shape of an oxide semiconductor thin film and/or structural stability of a transistor may be formed by doping an oxide channel with ions.

Any functional blocks shown in the figures and described above may be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

It should be understood that the example embodiments described herein should be considered in a descriptive sense only and not for purposes of limitation. Descriptions of features or aspects within each example embodiment should typically be considered as available for other similar features or aspects in other example embodiments. While one or more example embodiments have been described with reference to the figures, it will be understood by those of ordinary skill in the art that various changes in form and details may be made therein without departing from the spirit and scope as defined by the following claims.

What is claimed is:

1. A semiconductor device comprising:
a substrate;
a lower electrode on the substrate;
an oxide channel on the lower electrode, the oxide channel including vertical extension portions extending in a first direction perpendicular to the substrate;
an upper electrode on the oxide channel;
a gate insulator on a portion of the oxide channel that is exposed by the lower electrode and the upper electrode; and
a gate electrode on the gate insulator,
wherein the upper electrode and the lower electrode are separated from each other by the oxide channel in the first direction, and the oxide channel is doped with anions selected from the group consisting of F (Fluorine), Cl (Chlorine), Br (Bromine), I (Iodine), At (Astatine), and a combination thereof.

2. The semiconductor device of claim 1, wherein the oxide channel includes one selected from the group consisting of In (Indium), Zn (Zinc), Sn (Tin), Ga (Gallium), Hf (Hafnium), and a combination thereof.

3. The semiconductor device of claim 1, wherein the oxide channel includes In, and an atomic percentage of In included in the oxide channel is about 5 at % to about 55 at %.

4. The semiconductor device of claim 1, wherein the oxide channel includes Ga of about 30 at % to about 45 at %.

5. The semiconductor device of claim 1, wherein the lower electrode includes at least one of W (Tungsten), Co (Cobalt), Ni (Nickel), Fe (Iron), Ti (Titanium), Mo (Molybdenum), Cr (Chromium), Zr (Zirconium), Hf (Hafnium), Nb (Niobium), Ta (Tantalum), Ag (Silver), Au (Gold), Al (Aluminum), Cu (Copper), Sb (Antimony), V (Vanadium), Ru (Ruthenium), Pt (Platinum), Zn (Zinc), and Mg (Magnesium).

6. The semiconductor device of claim 1, wherein each of the oxide channel, the gate insulator, and the gate electrode extends longer in the first direction than in a second direction parallel to the substrate.

7. The semiconductor device of claim 1, wherein the gate electrode surrounds the oxide channel.

8. The semiconductor device of claim 1, wherein the oxide channel has a U-shaped cross section.

9. The semiconductor device of claim 1, wherein the lower electrode and the oxide channel have a same width.

10. The semiconductor device of claim 1, wherein
the oxide channel includes
a bottom portion in contact with the lower electrode, and
the vertical extension portions extending in the first direction at both ends of the bottom portion, and
a first mass percentage of anions of the bottom portion is greater than a second mass percentage of anions of the vertical extension portions.

11. The semiconductor device of claim 10, wherein the first mass percentage of anions of the bottom portion of the oxide channel is greater than about 10.0 wt % and less than about 50.0 wt %.

12. The semiconductor device of claim 10, wherein the second mass percentage of anions in the vertical extension portions of the oxide channel is about 0.1 wt % to about 10.0 wt %.

13. The semiconductor device of claim 10, wherein
the vertical extension portions include
a first vertical extension portion extending from a first end of the bottom portion in the first direction, and
a second vertical extension portion extending from a second end of the bottom portion in the first direction, and
the gate electrode includes
a first gate electrode on the first vertical extension portion and extending in the first direction, and
a second gate electrode on the second vertical extension portion and extending in the first direction.

14. A method of manufacturing a semiconductor device, the method comprising:
providing a lower electrode on a substrate;
depositing an oxide channel on the lower electrode;
doping the oxide channel with anions selected from the group consisting of F (Fluorine), Cl (Chlorine), Br (Bromine), I (Iodine), At (Astatine), and a combination thereof;
depositing a gate insulator on the oxide channel;
depositing a gate electrode on the gate insulator; and
depositing an upper electrode on the oxide channel,
wherein the upper electrode and the lower electrode are spaced apart from each other by the oxide channel in a first direction perpendicular to the substrate,
the oxide channel includes vertical extension portions extending in the first direction, and
the upper electrode contacts a top surface of the oxide channel.

15. The method of claim 14, wherein the oxide channel includes In of about 5 at % to about 55 at % and Ga of about 30 at % to about 45 at %.

16. The method of claim 14, wherein
the depositing the oxide channel includes depositing the oxide channel that includes a bottom portion contacting the lower electrode and the vertical extension portions extending from the bottom portion in the first direction, the doping the oxide channel with the anions includes doping the vertical extension portions of the oxide channel, and doping the bottom portion of the oxide channel, and a first mass percentage of anions in the bottom portion is greater than a second mass percentage of anions in the vertical extension portions.

17. The method of claim 16, wherein the first mass percentage of anions in the bottom portion of the oxide channel is in a range from about 10.0 wt % to about 50.0 wt %.

18. The method of claim 16, wherein the second mass percentage of anions in the vertical extension portions of the oxide channel is in a range from about 0.1 wt % to about 10.0 wt %.

* * * * *